(12) United States Patent  (10) Patent No.: US 8,110,907 B2
Yamaguchi et al.  (45) Date of Patent: Feb. 7, 2012

(54) SEMICONDUCTOR DEVICE INCLUDING FIRST SUBSTRATE HAVING PLURALITY OF WIRES AND A PLURALITY OF FIRST ELECTRODES AND A SECOND SUBSTRATE INCLUDING A SEMICONDUCTOR CHIP BEING MOUNTED THEREON, AND SECOND ELECTRODES CONNECTED WITH FIRST ELECTRODES OF FIRST SUBSTRATE

(75) Inventors: Masahiro Yamaguchi, Tokyo (JP); Emi Sawayama, Tokyo (JP); Hiroshi Oyama, Tokyo (JP); Shigeharu Tsunoda, Tokyo (JP); Yasuo Amano, Tokyo (JP); Naoki Matsushima, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 278 days.

(21) Appl. No.: 12/318,798

(22) Filed: Jan. 8, 2009

(65) Prior Publication Data
US 2009/0206492 A1 Aug. 20, 2009

(30) Foreign Application Priority Data
Feb. 14, 2008 (JP) .................................. 2008-033008

(51) Int. Cl.
*H01L 23/48* (2006.01)

(52) U.S. Cl. .................. 257/686; 257/E23.01; 257/777; 257/723; 257/685; 257/691; 257/208; 257/207; 257/203; 257/211; 257/698; 257/696; 349/149; 349/143; 349/150; 349/152; 349/151

(58) Field of Classification Search .................. 257/686, 257/777, 723, 685, 691, 208, 207, 203, 211, 257/698, 696; 349/149, 143, 150, 152, 151
See application file for complete search history.

(56) References Cited

U.S. PATENT DOCUMENTS

| 4,586,789 A | * | 5/1986 | Kishimoto et al. | 349/152 |
| 4,835,510 A | * | 5/1989 | Shibasaki et al. | 338/32 R |
| 5,757,450 A | * | 5/1998 | Fujii et al. | 349/106 |
| 5,914,763 A | * | 6/1999 | Fujii et al. | 349/149 |

(Continued)

FOREIGN PATENT DOCUMENTS

JP   2001-110978   4/2001

(Continued)

OTHER PUBLICATIONS

Korean Office Action dated Oct. 25, 2010, with partial Japanese and English translation.

*Primary Examiner* — A O Williams
(74) *Attorney, Agent, or Firm* — McGinn Intellectual Property Law Group, PLLC

(57) ABSTRACT

A semiconductor device includes a semiconductor chip, a first substrate, and a second substrate. The first substrate includes a plurality of wires and a plurality of first electrodes, each first electrode being connected with each wire. The second substrate includes the semiconductor chip that is mounted thereon, and a plurality of second electrodes with, each second electrode being connected with the each first electrode of the first substrate. The widths of the wires of the first substrate are different depending on the lengths of the wires. By changing the widths of the wires depending on their lengths, it is possible to reduce variation in stiffness of the electrodes and vicinities of electrodes, whereby variation in ultrasonic bonding strength can be reduced.

19 Claims, 12 Drawing Sheets

U.S. PATENT DOCUMENTS

| | | | |
|---|---|---|---|
| 6,239,496 B1* | 5/2001 | Asada | 257/777 |
| 6,459,049 B1* | 10/2002 | Miller et al. | 174/261 |
| 6,506,627 B1* | 1/2003 | Murakamz et al. | 438/118 |
| 6,853,092 B2* | 2/2005 | Ashida | 257/786 |
| 7,615,870 B2* | 11/2009 | Shibamoto et al. | 257/777 |
| 7,915,718 B2* | 3/2011 | Lee et al. | 257/668 |
| 2003/0052409 A1 | 3/2003 | Matsuo et al. | |
| 2004/0051119 A1* | 3/2004 | Kikuma et al. | 257/200 |
| 2004/0140547 A1 | 7/2004 | Yamazaki et al. | |
| 2006/0214306 A1 | 9/2006 | Yamazaki et al. | |
| 2006/0249829 A1* | 11/2006 | Katagiri et al. | 257/686 |
| 2007/0013084 A1* | 1/2007 | Kinsman | 257/786 |
| 2007/0169960 A1* | 7/2007 | Hayashi | 174/262 |
| 2008/0067661 A1* | 3/2008 | Kawabata | 257/686 |
| 2008/0084530 A1* | 4/2008 | Hirabayashi et al. | 349/150 |
| 2008/0142993 A1* | 6/2008 | Ozawa et al. | 257/778 |
| 2008/0150115 A1* | 6/2008 | Watanabe et al. | 257/686 |
| 2008/0153203 A1* | 6/2008 | Sato et al. | 438/108 |
| 2008/0284043 A1* | 11/2008 | Hagen et al. | 257/777 |
| 2009/0134506 A1* | 5/2009 | Yamaguchi et al. | 257/686 |
| 2009/0294978 A1* | 12/2009 | Ota et al. | 257/773 |
| 2010/0032202 A1* | 2/2010 | Higashitani | 174/264 |

FOREIGN PATENT DOCUMENTS

| | | |
|---|---|---|
| JP | 2006-278863 | 10/2006 |
| KR | 1999-013513 | 2/1999 |
| KR | 2001-0051757 A | 6/2001 |
| KR | 10-2003-0019187 A | 3/2003 |
| KR | 10-2004-0054495 A | 6/2004 |

* cited by examiner

SEMICONDUCTOR DEVICE INCLUDING FIRST SUBSTRATE HAVING PLURALITY OF WIRES AND A PLURALITY OF FIRST ELECTRODES AND A SECOND SUBSTRATE INCLUDING A SEMICONDUCTOR CHIP BEING MOUNTED THEREON, AND SECOND ELECTRODES CONNECTED WITH FIRST ELECTRODES OF FIRST SUBSTRATE

BACKGROUND OF THE INVENTION

This application is based upon and claims the benefit of priority from Japanese patent application No. 2008-033008, filed on Feb. 14, 2007, the disclosure of which is incorporated herein in its entirety by reference.

1. Field of the Invention

The present invention relates to a semiconductor device, and in particular, relates to a semiconductor device manufactured using ultrasonic bonding.

2. Description of the Related Art

As semiconductor devices have achieved higher performance, higher operation speed and larger capacity, it has become more important for a semiconductor device to be able to have a plurality of semiconductor chips mounted on a substrate of a limited size. Therefore, the development of a stacked type semiconductor device adopting a laminated structure, in which a plurality of semiconductor chips are stacked on a base substrate in multiple stages, has been in progress.

In a case of manufacturing a stacked type semiconductor device where a plurality of semiconductor chips are stacked, each of the semiconductor chips is electrically connected with the base substrate by wire bonding or the like after being mounted on the base substrate.

There are also other methods of manufacturing a stacked type semiconductor device, such as a method in which a plurality of semiconductor chips are stacked using flexible substrates as interposers. In such a stacked type semiconductor device, each semiconductor chip is electrically connected with the base substrate through the flexible substrate which is a flexible inter-connecting layer that is inserted between each adjacent semiconductor chip.

This flexible inter-connecting layer is capable of reducing possible stress that could be caused by the difference in thermal expansion coefficients between the semiconductor chip and the base substrate, or the like. Thereby, it is possible to prevent cracks from being generated at the connecting portion (cf. Japanese Patent Laid-Open No. 2001-110978).

Japanese Patent Laid-Open No. 2006-278863 discloses a stacked type semiconductor package in which a plurality of packages, each of which including a flexible substrate and a semiconductor chip fixed to the flexible substrate, are stacked. In this case, a wire formed on the flexible substrate is extends from only one side of the semiconductor chip. The end of the extending wire is connected with a wire of the base substrate. Therefore, with this stacked type semiconductor package, high density packaging is made possible while high reliability with a semiconductor device is secured.

In a semiconductor package using flexible substrates as interposers, an electrode part provided at the flexible substrate and an electrode part provided at the base substrate are connected by soldering, ultrasonic bonding, or the like. With ultrasonic bonding, in particular, electrode parts in respective layers can be bonded in a batch around room temperature, and moreover, it is possible to keep the residual stress small after bonding.

FIG. 1 and FIG. 2 are diagrams illustrating how flexible substrate 20, with semiconductor chip 10 mounted thereon, and base substrate 12 are bonded by ultrasonic bonding. FIG. 1 is a sectional view of a semiconductor device, and FIG. 2 is a perspective view of the semiconductor device.

Semiconductor chip 10 is flip-chip bonded to flexible substrate 20 through bumps (not shown). The semiconductor device is being held by stage 31 in FIG. 1.

FIG. 3A is a plane view of a flexible substrate, and FIG. 3B is a sectional view of the flexible substrate. Wires 22 are formed on the both surfaces of flexible substrate 20. Wires 22 on the surfaces of both sides of flexible substrate 20 are electrically connected each other through filled via 24. Gold electrode 23 is formed on a surface of each wire 22. Gold electrodes 23 on the surfaces of wires 22 of flexible substrate 20 are aligned with the positions of gold electrodes 13 on the surfaces of wires 11 of base substrate 12 so that each of gold electrodes 13 and each of gold electrodes 23 contact each other. In this state, ultrasonic wave is oscillated by ultrasonic tool 30, whereby each of a plurality of gold electrodes 13 and each of a plurality of gold electrodes 23 will be bonded to each other in a batch.

FIG. 4 is a plane view of a base substrate where a plurality of wires with different lengths are formed. FIG. 5 is a graphic representation showing positional dependency of bonding strength between gold electrodes 13 of base substrate 12 and gold electrodes 23 of flexible substrate 20 when they are bonded each other by ultrasonic bonding.

FIG. 5 shows bonding strengths measured at four bonding positions 13a, 13b, 13c and 13d shown in FIG. 4. Moreover, FIG. 5 shows a bonding strength at each of these bonding positions as a ratio to a maximum value of bonding strength when the direction of ultrasonic vibration is parallel to the wiring direction.

Referring to FIG. 5, it can be noted that the bonding strength between the gold electrode of flexible substrate 20 and the gold electrode of base substrate 12, when the direction of ultrasonic vibration is parallel to the wiring direction, depends on the length of wire 11 of base substrate 12. As the length of wire 11 of base substrate 12 becomes longer, the bonding strength increases. On the other hand, when the direction of ultrasonic vibration is perpendicular to the wiring direction, dependency of the bonding strength with respect to the length of wire decreases, whereby variation in bonding strength will be reduced. In this case, however, the bonding strength will decrease.

FIG. 6 is a plane view of a base substrate including a plurality of wires with the same lengths extending from gold electrodes. FIG. 7 is a graphic representation showing positional dependency of bonding strength between gold electrodes 13 of base substrate 12, shown in FIG. 6, and gold electrodes 23 of flexible substrate 20, when they are bonded by ultrasonic bonding. In this case, ultrasonic bonding is carried out while the direction of ultrasonic vibration is rendered parallel to the wiring direction.

Referring to FIG. 7, it can be noted that variation in bonding strength is small among bonding positions 13a, 13b, 13c and 13d on base substrate 12. However, in this case, the bonding strength decreases.

As illustrated above, in the case of bonding gold electrodes 13 of base substrate 12 and gold electrodes 23 of flexible substrate 20 by ultrasonic bonding, the length of wires and the direction of ultrasonic vibration have great influence on the bonding strength between gold electrodes 13 and 23.

In ultrasonic bonding, gold electrodes 13 and 23 are bonded by transmitting vibration of the ultrasonic wave to gold electrodes 13 and 23 so as to let gold electrodes 13 and 23 rub one another. Therefore, when there is variation in the stiffness of gold electrodes 13 and in the stiffness of vicinities of them, variation in bonding strength will also be caused among respective bonding portions.

In addition, wire 11 is generally made of metal. Therefore, when wire 11 connected to gold electrode 13 is adhered tightly to base substrate 12, stiffness of gold electrode 13 and stiffness of vicinity of gold electrode 13 will be strong. In other words, when ultrasonic vibration is carried out, wire 11 will be deformed along with base substrate 12, whereby the stiffness of base substrate 12 will be decreased. As the stiffness decreases, ultrasonic energy will be lost and bonding strength at respective bonding portions will decrease, which is a behavior that is recognized as a problem that needs to be considered.

Moreover, a process window with respect to ultrasonic bonding will become smaller, when appropriate bonding conditions are different among individual electrodes 13 due to the influence of the wire length and due to the direction of ultrasonic vibration, etc.

SUMMARY

It is therefore an object of the present invention to resolve the above-described problems.

In one exemplary embodiment, a semiconductor device includes a semiconductor chip, a first substrate, and a second substrate. The first substrate includes a plurality of wires and a plurality of first electrodes, each first electrode being connected with each wire. The second substrate includes the semiconductor chip being mounted thereon, and a plurality of second electrodes, each second electrode being connected with the each first electrode of the first substrate. Widths of the wires of the first substrate are different depending on lengths of the wires.

The above and other objects, features and advantages of the present invention will become apparent from the following description with reference to the accompanying drawings which illustrate examples of the present invention.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Exemplary Embodiment

Figure 8:
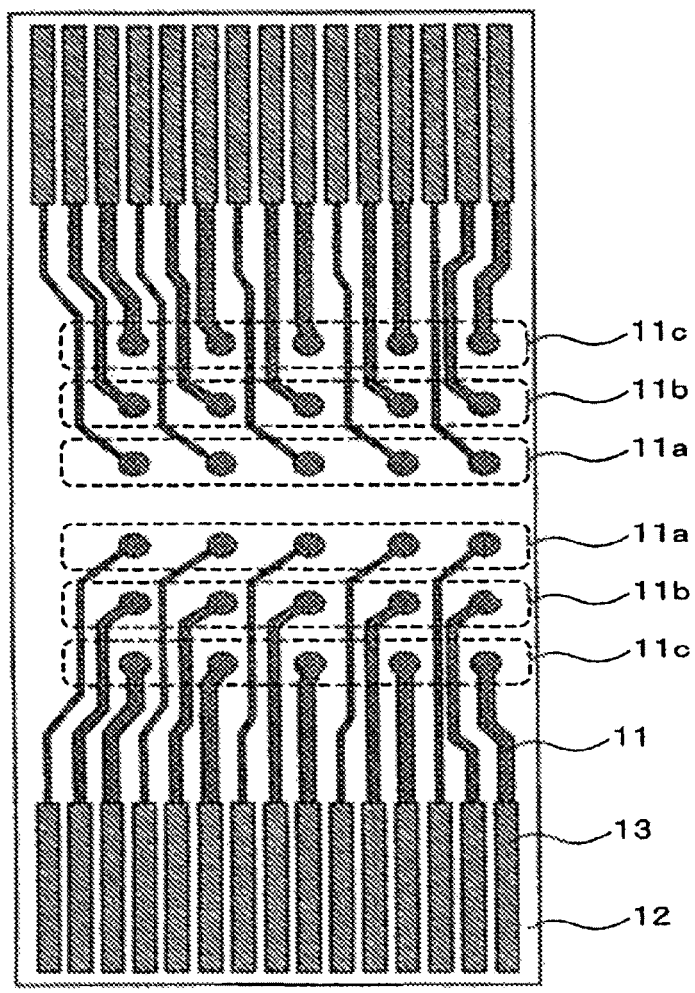
FIG. 8 is a plane view of a base substrate according to a first exemplary embodiment.

FIG. 8 is a plane view of a base substrate used in a semiconductor device according to a first exemplary embodiment.

A plurality of electrodes are formed at both sides on one surface of base substrate 12 as first substrate. Gold electrodes 13 can be used as the electrodes. Wires 11 extend from respective gold electrodes 13 to filled vias 24 which are positioned in a central portion of base substrate 12. Electrode pads (not shown) are provided on the another surface of base substrate 12. The wires on the one surface of base substrate 12 and the electrode pads on another surface of base substrate 12 are electrically connected through filled vias. Gold electrodes 13 of base substrate 12 and electrodes that are provided on second substrate are bonded by ultrasonic bonding.

Figure 1:
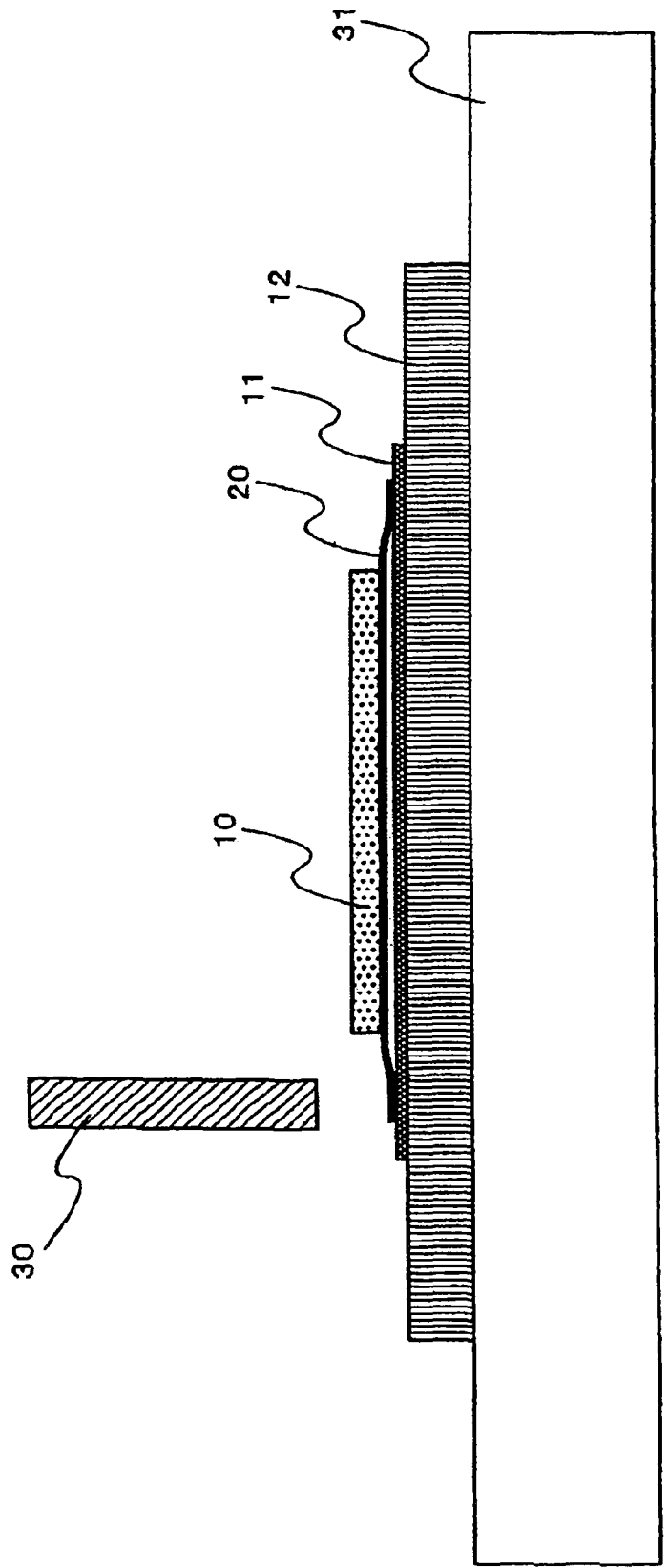
FIG. 1 is a sectional view of a semiconductor device including a flexible substrate and a base substrate.
Figure 2:
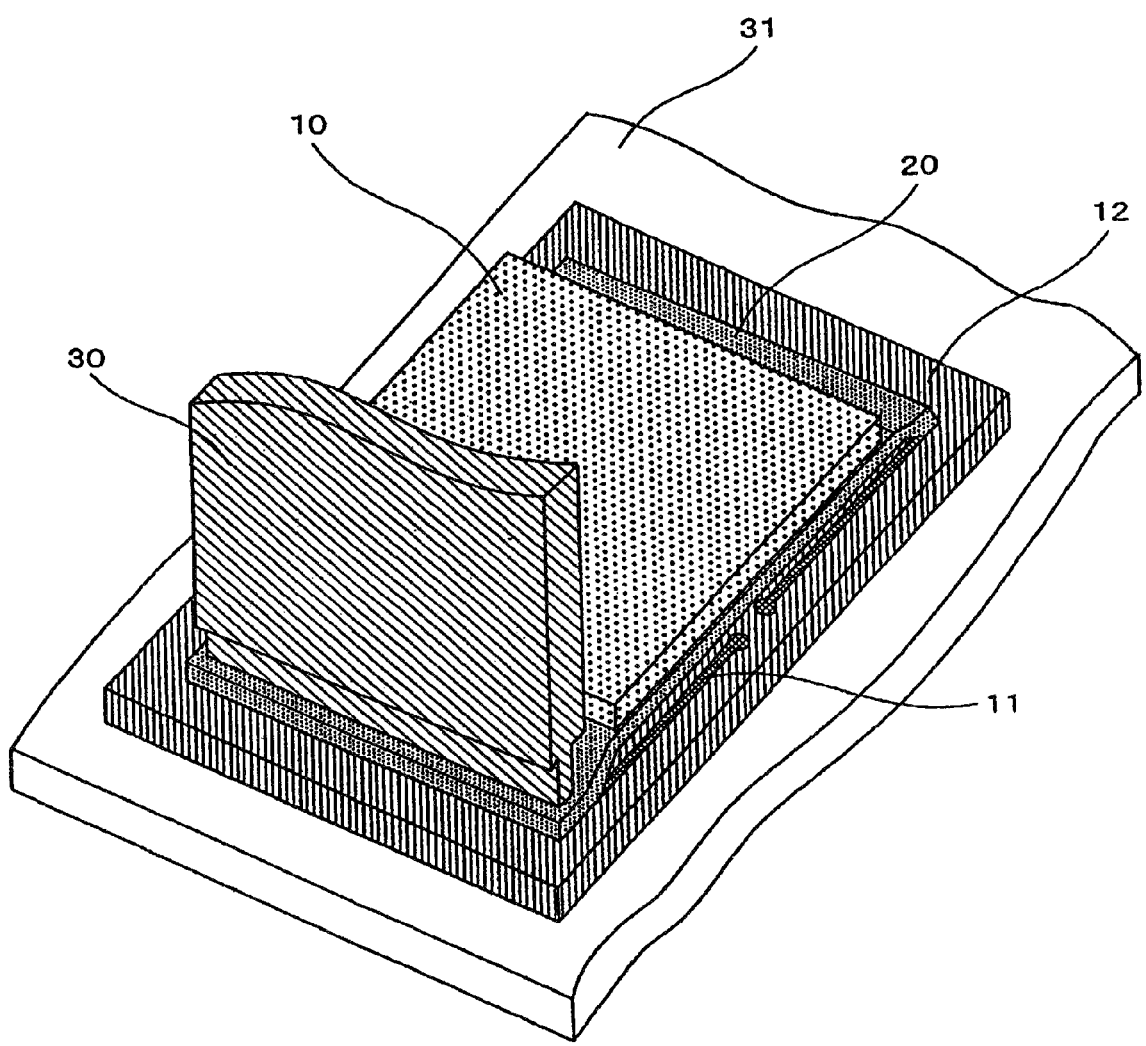
FIG. 2 is a perspective view of a semiconductor device including a flexible substrate and a base substrate.
Figure 3A:
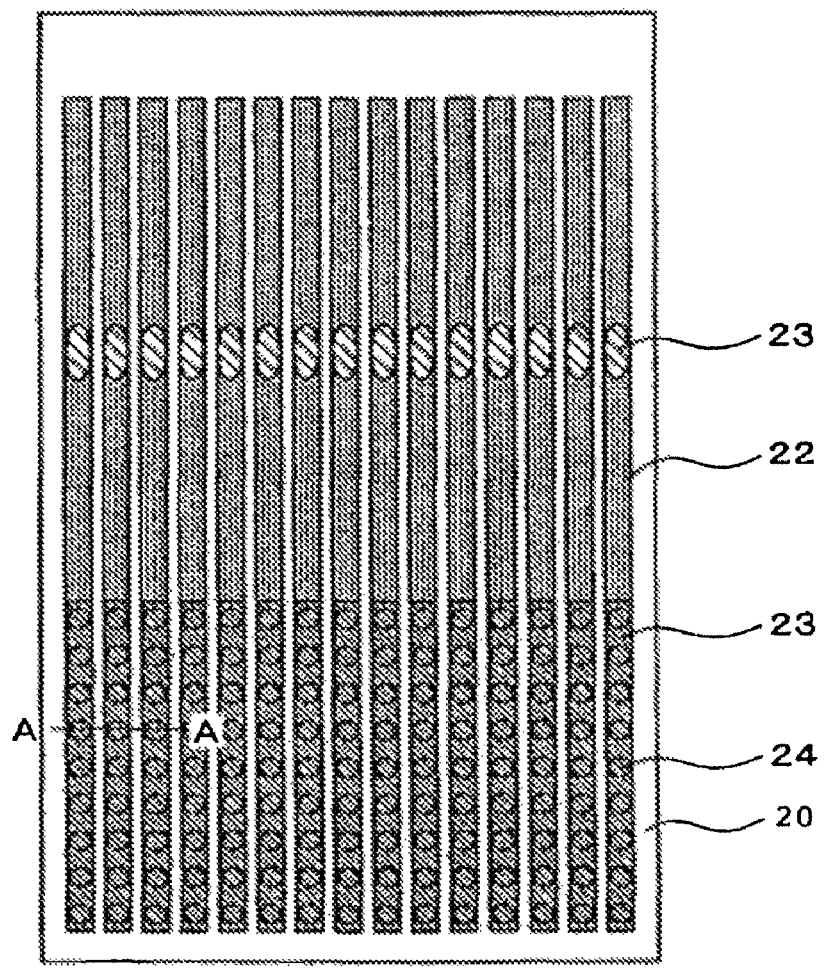
FIG. 3A is a plane view of a flexible substrate.
Figure 3B:
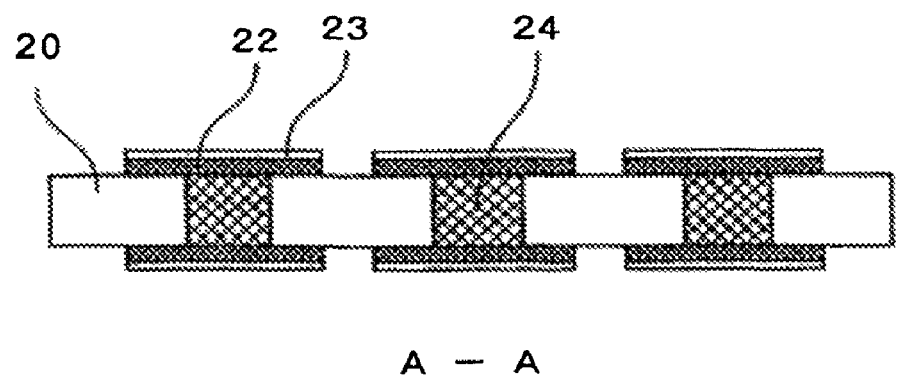
FIG. 3B is a sectional view of the flexible substrate taken along a line A-A in FIG. 3A.
Figure 4:
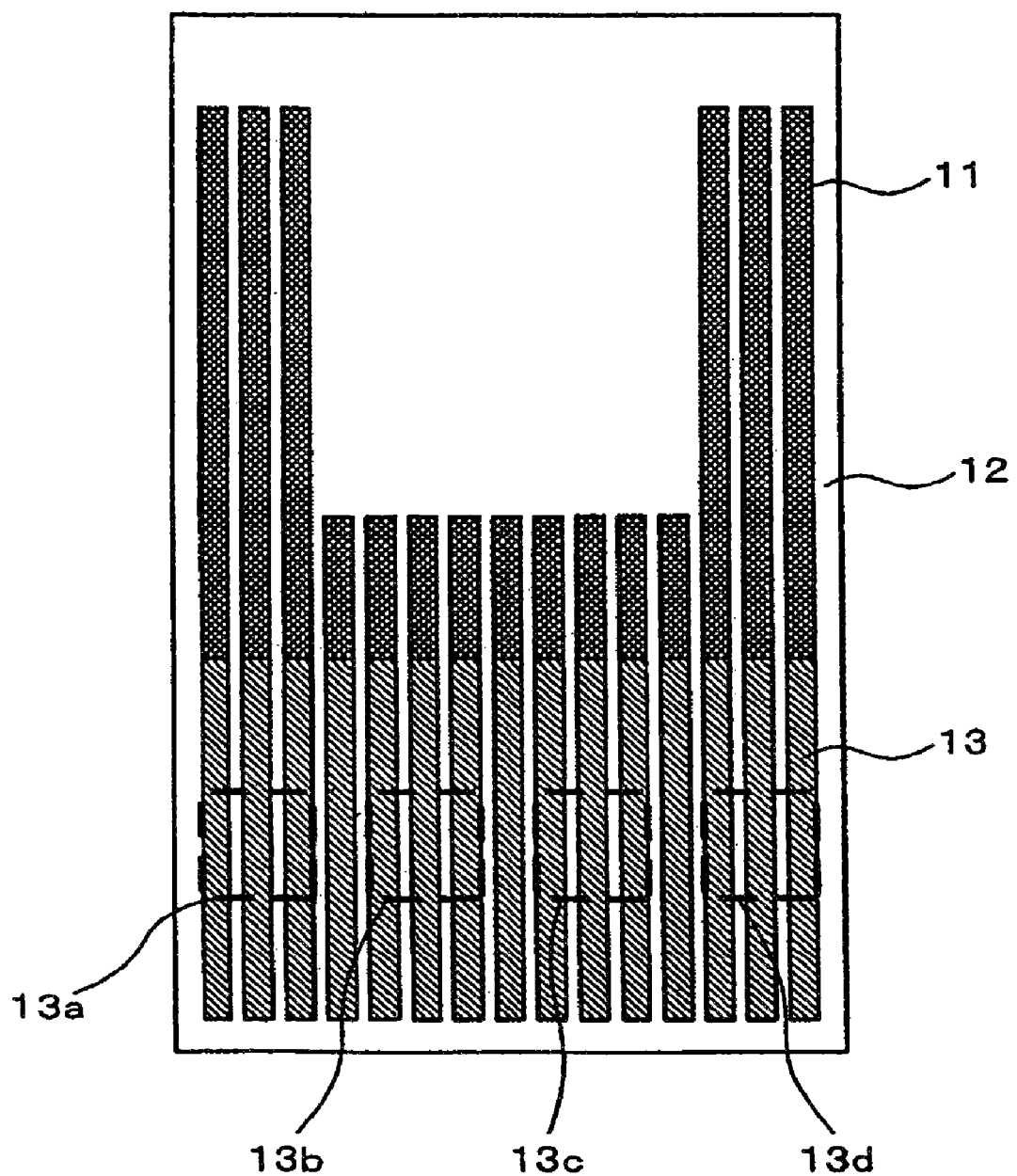
FIG. 4 is a plane view of a base substrate including wires with different lengths.
Figure 5:
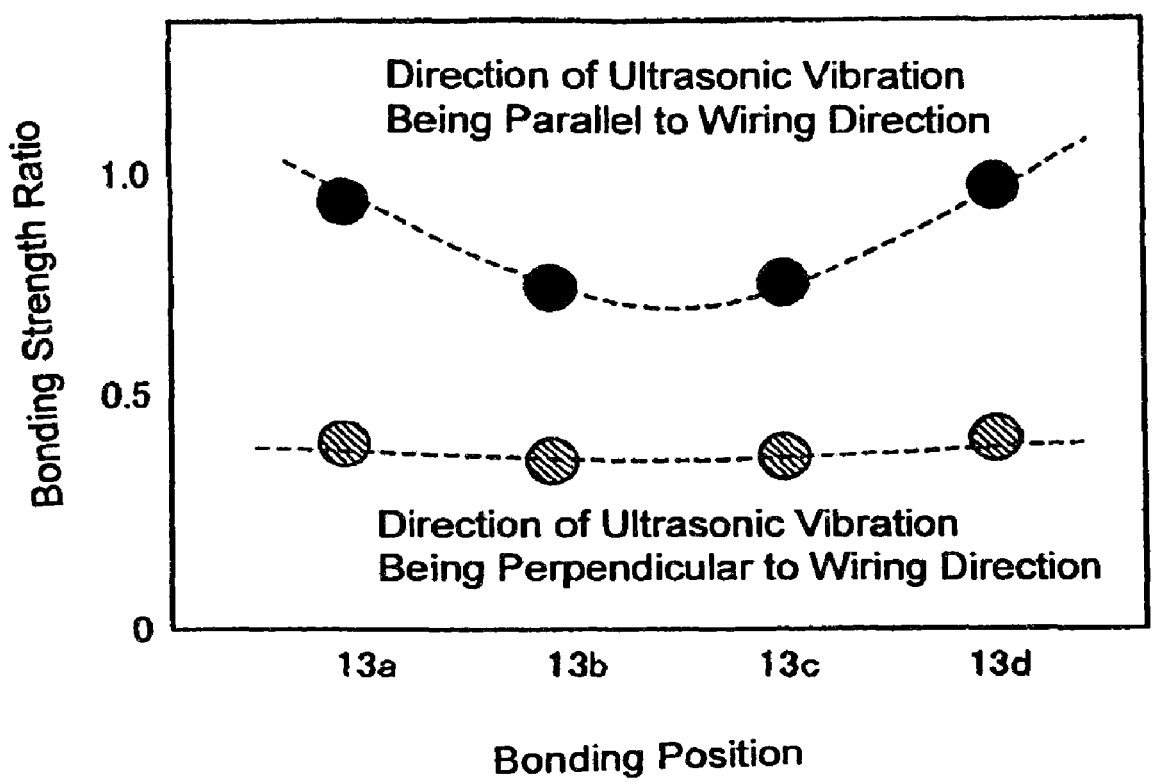
FIG. 5 is a graphic representation showing the relation between bonding strength and bonding position in ultrasonic bonding with respect to the base substrate shown in FIG. 4.
Figure 6:
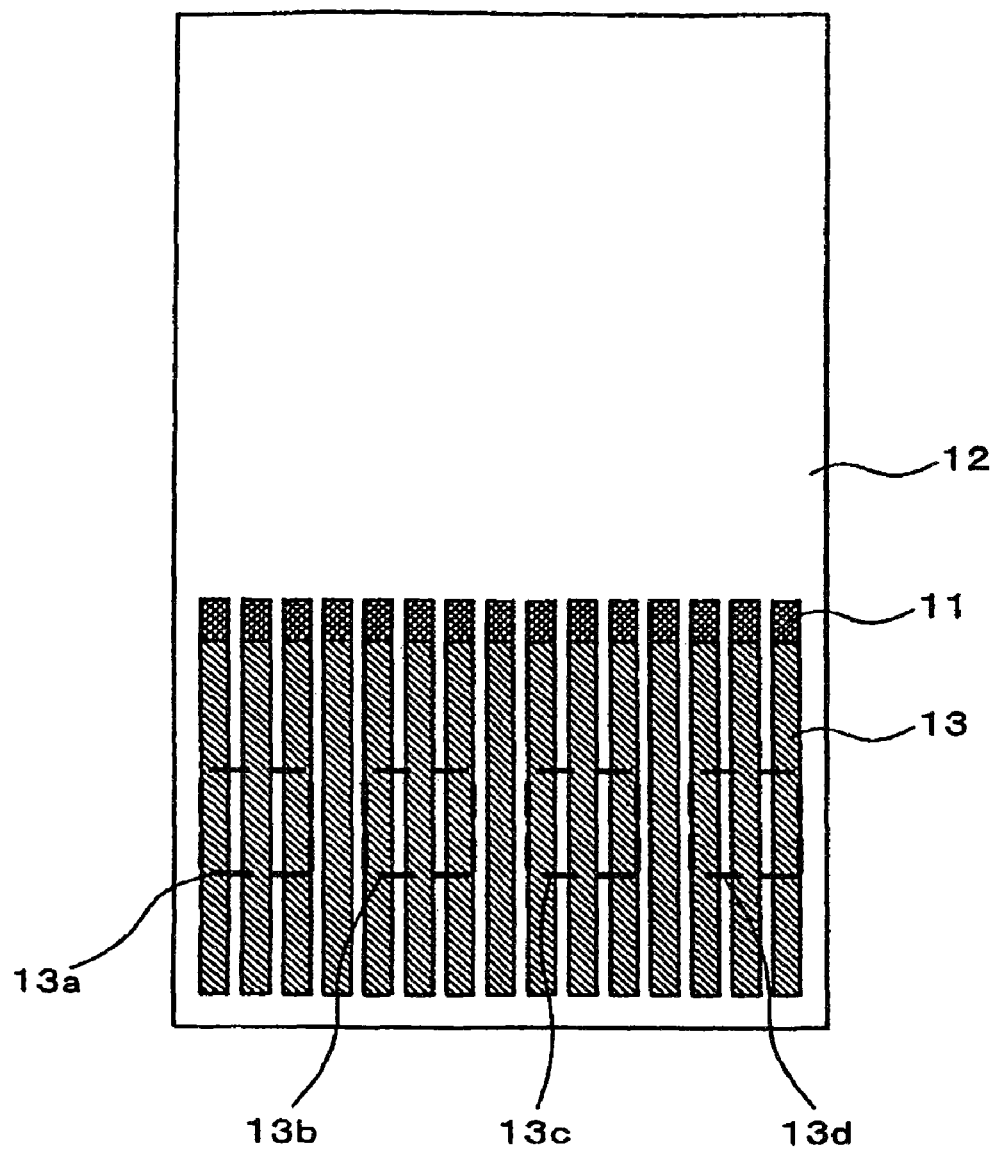
FIG. 6 is a plane view of a base substrate including wires having the same lengths.
Figure 7:
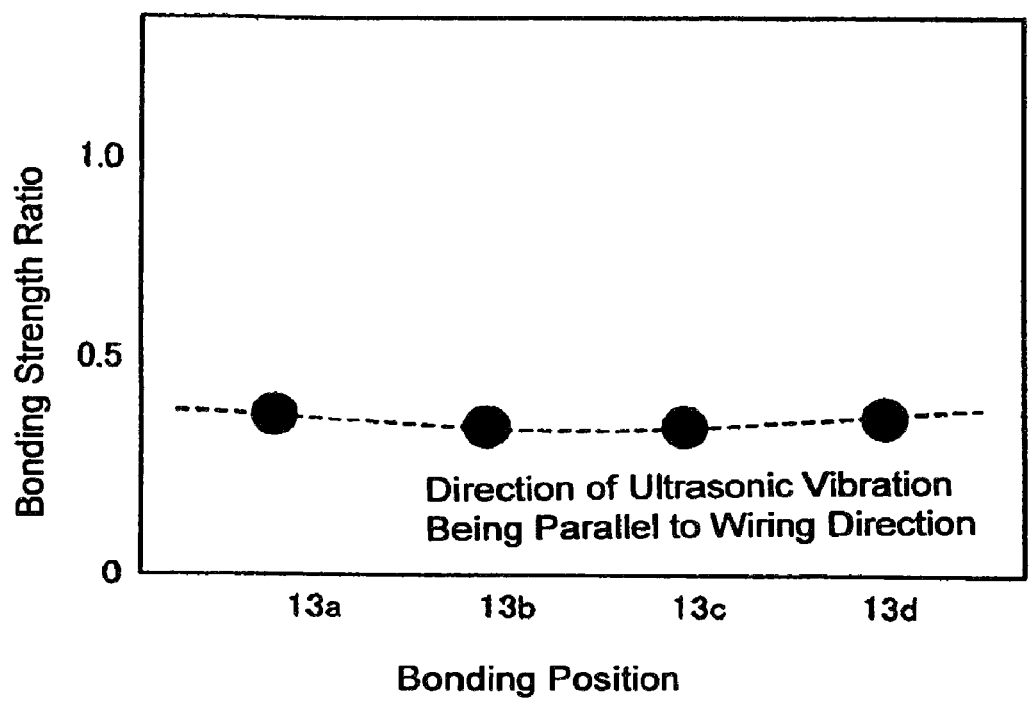
FIG. 7 is a graphic representation showing the relation between bonding strength and bonding position in ultrasonic bonding with respect to the base substrate shown in FIG. 6.

As for "second substrate", a flexible substrate can be used. The flexible substrate to be used here can be similar to the one shown in FIG. 3A and FIG. 3B. Wires 22 are formed on the surfaces of both sides of flexible substrate 20. Wires 22 on the both surfaces of flexible substrate 20 are electrically connected through filled vias 24 each other. Gold electrode 23 is formed on the surface of wires 22. Gold electrodes 23 on the surfaces of wires 22 of flexible substrate 20 are aligned with the positions of gold electrodes 13 on the surfaces of wires 11 of base substrate 12 so that each of gold electrodes 13 and each of gold electrodes 23 contact each other. In this state, an ultrasonic wave is oscillated by ultrasonic tool 30, whereby each of a plurality of gold electrodes 13 and each of a plurality of gold electrodes 23 will be bonded to each other in a batch.

As described above, in the present exemplary embodiment, a substrate of a double-sided bonding type is used as base substrate 12. Lengths of wires 11 formed on one surface (i.e. the surface shown in FIG. 8) of base substrate 12 are different depending on the positions of solder pads (not shown) formed on the other surface of base substrate 12. Given that the wires in wire assembly 11a extended to the vias arranged at positions farthest away from gold electrodes 13, the wires in wire assembly 11b extend to the vias arranged at positions moderately distant from gold electrodes 13, and the wires in wire assembly 11c extend to the vias arranged at positions nearest from gold electrodes 13; wire width w2 of the wires of wire assembly 11b is wider than wire width w1 of the wires in wire assembly 11a, and wire width w3 of the wires of wire assembly 11c is wider than wire width w2 of the wires in wire assembly 11b. Therefore, since the wire widths are under a relation of "w1<w2<w3", areas of the wires that extend from respective gold electrodes 13 will become nearly same. This means that stiffness of the gold electrodes and stiffness of base substrate 12 in their vicinities of the gold electrodes will become almost of the same degree. Accordingly, it will be possible to reduce variation in bonding conditions in ultrasonic bonding.

In this case, the bonding conditions will include; temperature, load, ultrasonic energy, bonding time, and so forth, at the time when the ultrasonic bonding is carried out. When there is variation in bonding conditions, it is possible that some bonding parts will be bonded under conditions that do not meet optimum bonding conditions. In such case, there may be a possibility that deformations of the filled vias will be caused during the bonding process.

Figure 9:
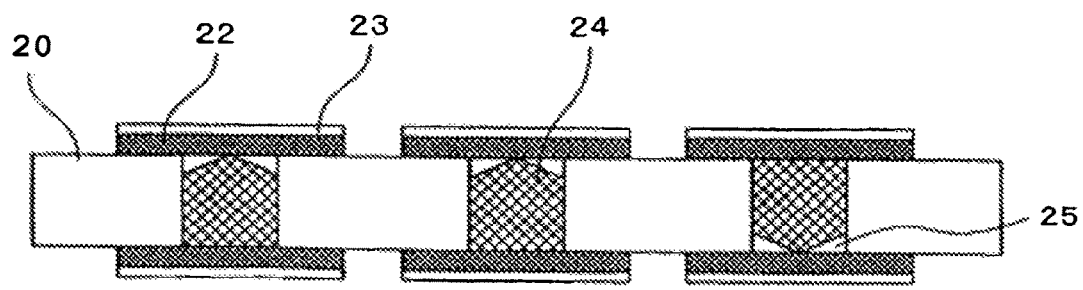
FIG. 9 is a sectional view of a flexible substrate including filled vias where cracks have been generated.

Moreover, in a case that is different from the present exemplary embodiment, when the wires of the base substrates all have the same widths, the problem, as will be described below, may occur. When ultrasonic bonding is carried out under the same conditions, the bonding process will be completed in an early stage at the positions with better bonding capability. Therefore, in the time for which the ultrasonic bonding process will be completed at other position, ultrasonic energy causes deformations of the filled vias at the positions with better bonding capability. Likewise, deformations of the filled vias in the flexible substrate to be connected with the base substrate may also be caused. FIG. 9 is a sectional view of the flexible substrate to be bonded to the base substrate. As shown in FIG. 9, when vias 24 are deformed, cracks 25 may be caused at the interfaces between wires 22 and vias 24.

According to the present exemplary embodiment, since variation in bonding conditions can be reduced, the problem as mentioned above can be resolved. Therefore, a semiconductor device having high connection reliability can be achieved.

In addition, because there is a rare possibility that one filled via 24 may become deformed and may become disconnected, it is better that flexible substrate 20 have a plurality of filled vias 24 formed for each wire in order to maintain electrical conductivities.

As mentioned earlier, when the direction of ultrasonic vibration is perpendicular to the wiring direction, variation in bonding strength will decrease. Furthermore, when the direction of ultrasonic vibration is parallel to the wiring direction, bonding strength will improve.

According to the present exemplary embodiment, by changing the wire widths according to the wire lengths, variation in bonding strength can be reduced.

As described above, with the present exemplary embodiment, since variation in bonding strength can be reduced, it is possible to prevent the vias of the flexible substrate from becoming deformed and disconnected.

Figure 10:
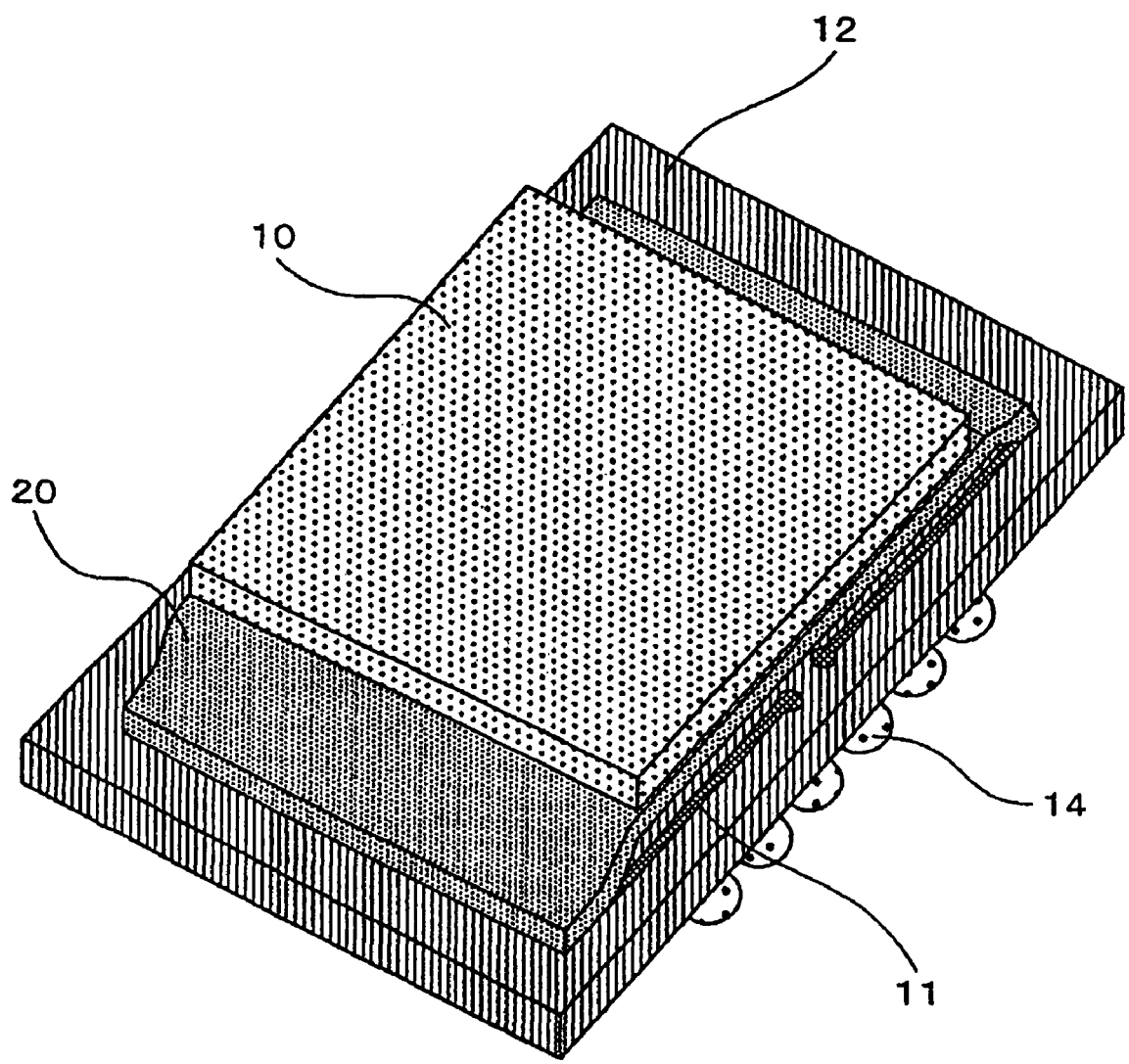
FIG. 10 is a perspective view of a semiconductor device according to the first exemplary embodiment.

FIG. 10 is a perspective view of a semiconductor device including a semiconductor chip. The semiconductor device includes semiconductor chip 10, base substrate 12, and flexible substrate 20. Structures of base substrate 12 and flexible substrate 20 are the same as those described above. Each of gold electrodes 13 of base substrate 12 and each of gold electrodes 23 of flexible substrate 20 are bonded to each other by ultrasonic bonding. Moreover, solder balls are formed on base substrate 12.

On the surface of each wire 22 of flexible substrate 20, gold electrode 23 is formed.

Semiconductor chip 10 is mounted around a central portion of flexible substrate 20. Semiconductor chip 10 is electrically connected with flexible substrate 20. Gold electrodes 23 of flexible substrate 20 are bonded to gold electrodes 13 of base substrate 12 by ultrasonic bonding.

Figure 11:
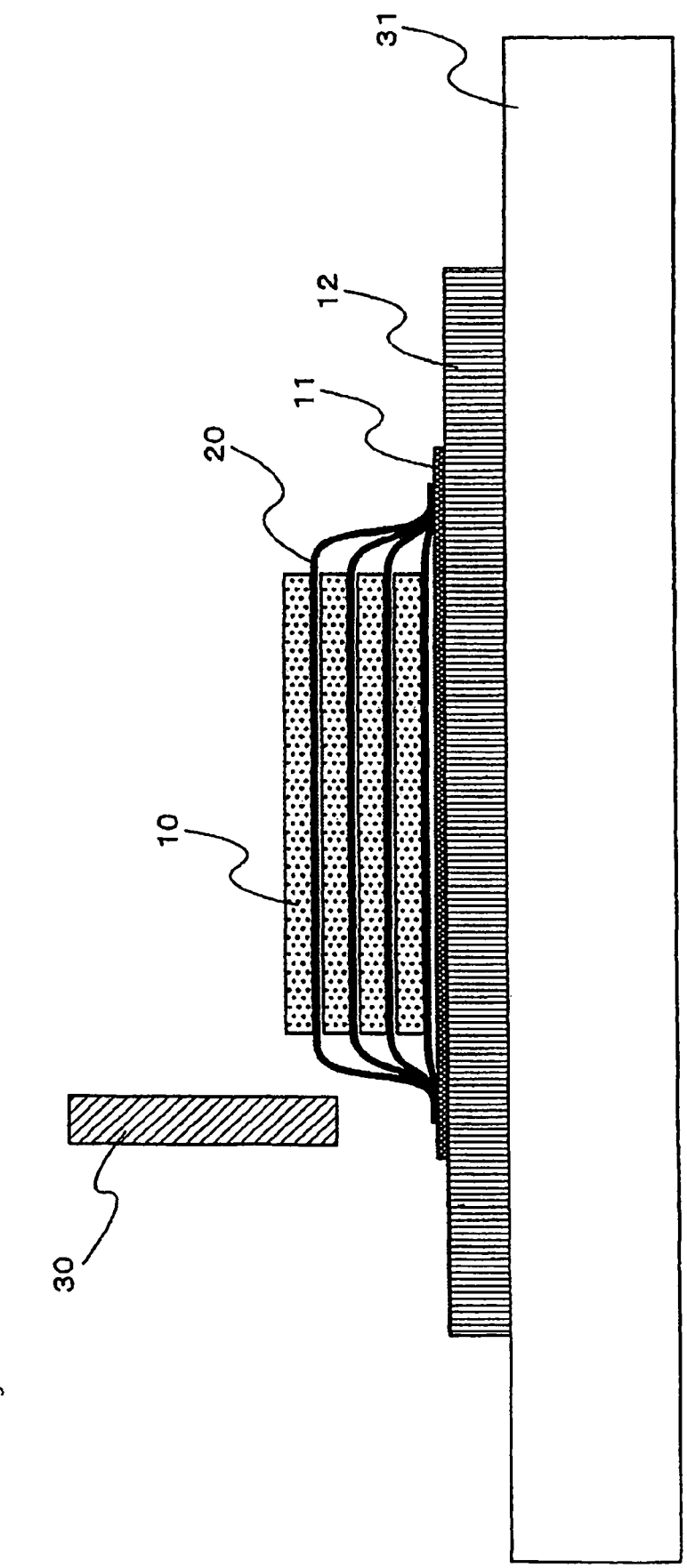
FIG. 11 is a sectional view of a stacked type semiconductor device according to a modified example of the first exemplary embodiment, showing a state in which ultrasonic bonding is being carried out.
Figure 12:
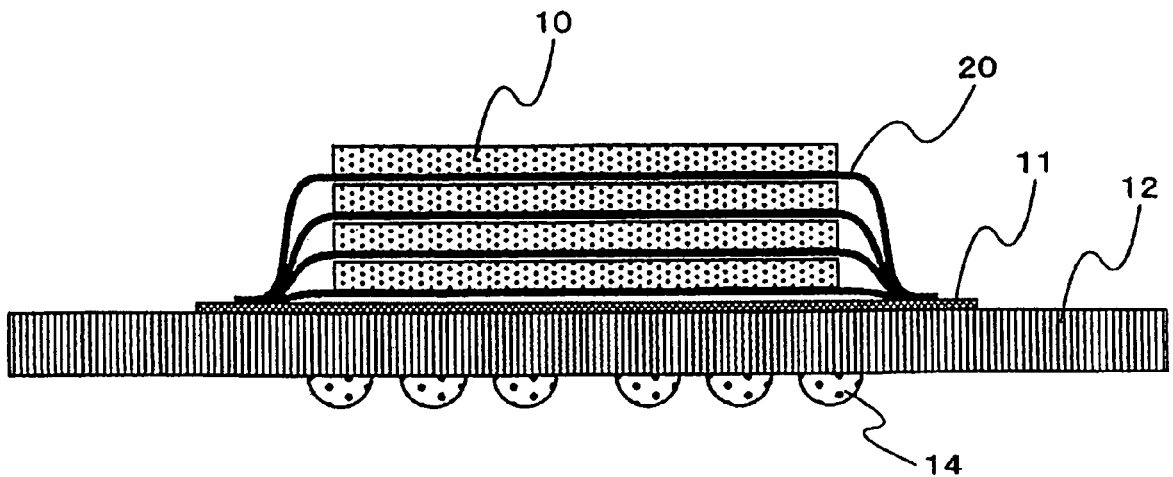
FIG. 12 is a sectional view of the stacked type semiconductor device according to the modified example of the first exemplary embodiment.

FIG. 11 and FIG. 12 are sectional views of a semiconductor device according to a modified example of the present exemplary embodiment. As shown in FIG. 11, by sequentially bonding flexible substrates 20, each of which has semiconductor chip 10 mounted thereon by ultrasonic bonding, a stacked type semiconductor device as shown in FIG. 12 can be obtained.

FIG. 11 also shows stage 31 which holds the semiconductor device at the time when ultrasonic bonding is carried out.

Even in such a case in which an adhesive or the like is used for fixing substrates to each other, it is preferable that flexible substrate 20 in the lowest stage and base substrate 12 be not fixed to each other by the adhesive. This is because flexible substrate 20 functions so as to reduce possible stress that can be produced by thermal expansion.

Furthermore, it is also possible to previously stack a plurality of flexible substrates 20, with each substrate 20 having semiconductor chip 10 mounted on it, in multiple stages, adjust positions of the gold electrodes at respective stages, and then carry out the ultrasonic bonding in a batch. In this case, the time necessary for bonding will become shorter. In addition, in the case of sequential ultrasonic bonding, there are possibilities in which the surface of the gold electrode that the ultrasonic tool has touched will become damaged after the ultrasonic bonding process is carried out in the lower stage. There are also cases in which the gold electrodes once bonded by ultrasonic bonding will become damaged by being vibrated again by the ultrasonic wave used in the ultrasonic bonding process for the semiconductor devices in the upper stage.

In the case of bonding the gold electrodes of the semiconductor devices in a batch, it is possible to prevent the gold electrodes from becoming damaged.

Second Exemplary Embodiment

Figure 13:
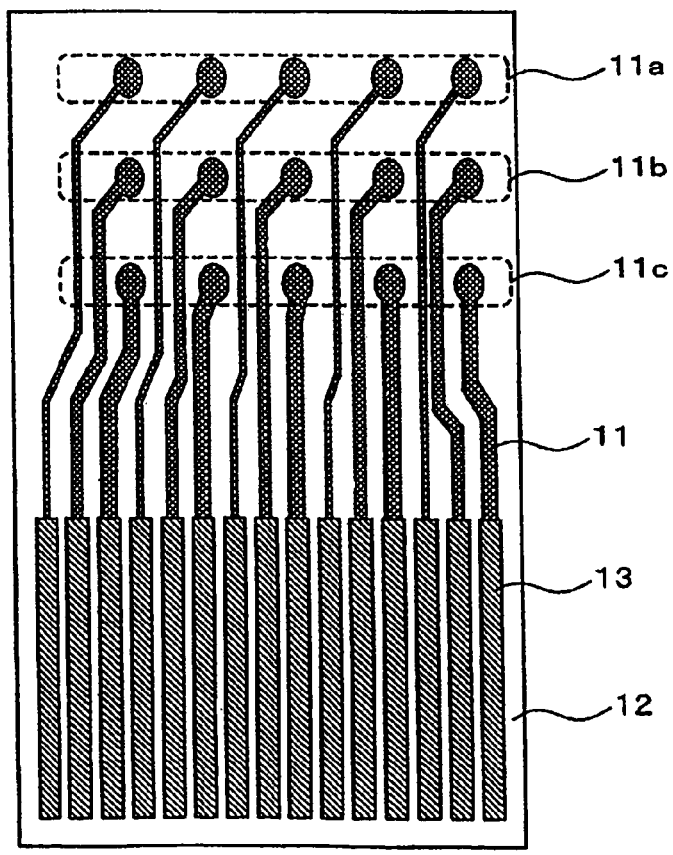
FIG. 13 is a plane view of a base substrate of a semiconductor device according to a second exemplary embodiment.

Now a second exemplary embodiment will be described. FIG. 13 is a plane view of a base substrate used in the present exemplary embodiment.

A plurality of electrodes are formed at one side of the one surface of base substrate 12. Gold electrodes 13 can be used as the electrodes. Wires 11 extend from respective gold electrodes 13 to filled vias 24 which are positioned in a central portion of base substrate 12. The rest of the structure is the same as in the case of the first exemplary embodiment.

Therefore, base substrate 12 shown in FIG. 13 is of a type that can be used in a semiconductor device including a semiconductor chip with wires extending from only one side. The wires formed on one surface of base substrate 12 have different lengths. The lengths of these wires are set according to the positions of solder pads, that is, the positions of filled vias 24, the solder pads being formed on another surface of base substrate 12. For instance, the wires can be arranged such that the wires in wire assembly 11a are connected to filled vias 24 arranged at positions farthest away from gold electrodes 13, such that the wires in wire assembly 11b are connected to filled vias 24 arranged at positions moderately distant from gold electrodes 13, and such that the wires in wire assembly 11c are connected to filled vias 24 arranged at positions nearest from gold electrodes 13. In this case, the widths of the wires are to be determined for the respective wire assemblies so that the stiffness of respective gold electrodes 13 will become approximately the same.

More specifically, the wires are to be arranged to become finer as they become longer.

Figure 14:
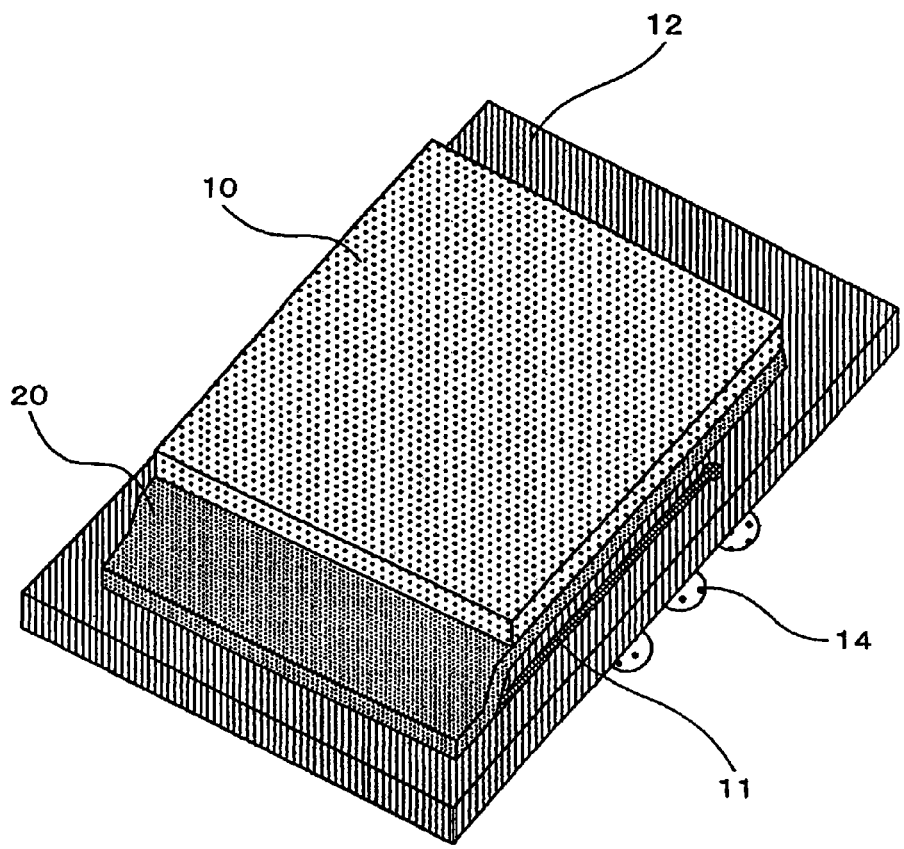
FIG. 14 is a perspective view of the semiconductor device according to the second exemplary embodiment.

As in the case of the first exemplary embodiment, semiconductor chip 10 is fillip-chip bonded to flexible substrate 20 (cf. FIG. 14). Gold electrodes 23 formed on the surface of flexible substrate 20 are bonded to gold electrodes 13 of base substrate 12 by ultrasonic bonding.

Since the wires of semiconductor chip 10 are drawn out from only one side, the mount area of semiconductor chip 10 with respect to base substrate 12 will become smaller, although there may be some limitations added to variations of the electrode pitch and the wire widths. Thus, miniaturization of the package will become possible.

FIG. 14 is a perspective view of the semiconductor device described above. The semiconductor device shown in FIG. 14 includes semiconductor chip 10, base substrate 12, and flexible substrate 20 being second substrate.

Solder balls 14 are formed at base substrate 12. Semiconductor chip 10 is mounted on flexible substrate 20. Solder balls 14 are connected with the electrode pads provided at the vias of base substrate 12.

Figure 15:
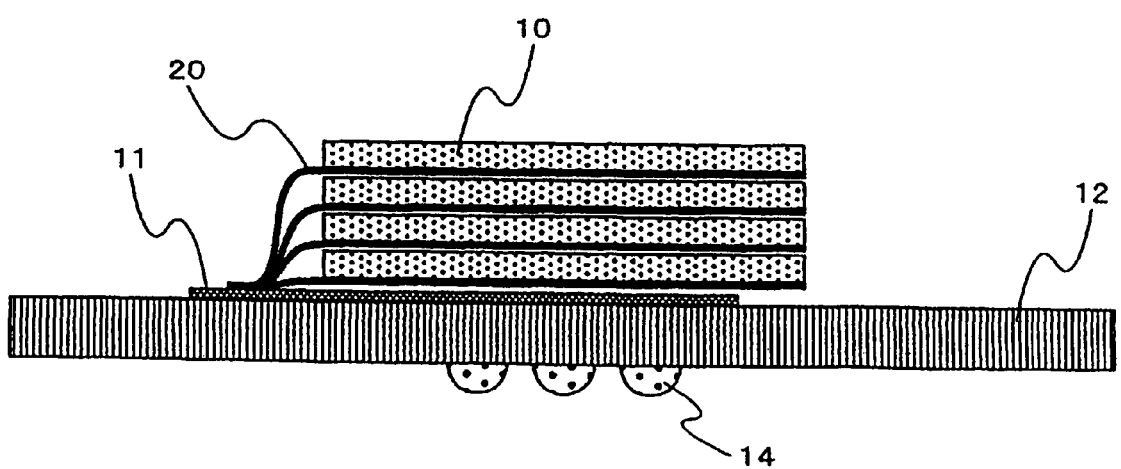
FIG. 15 is a sectional view of a stacked type semiconductor device according to a modified example of the second exemplary embodiment.

FIG. 15 is a sectional view of a four-stage stacked type semiconductor device. In the semiconductor device shown in FIG. 15, a plurality of flexible substrates 20 on which semiconductor chip is mounted are stacked in multiple stages. Furthermore, solder balls 14 are formed at base substrate 12. The relation between the lengths and widths of the wires of base substrate 12 is the same as the one mentioned above.

According to the present exemplary embodiment, variation in stiffness of the bonding portions can be reduced by adjusting the width of wires 11 of the base substrate.

Moreover, when the direction of ultrasonic vibration is perpendicular to the wiring direction, variation in bonding strength among the respective bonding portions can be reduced even further.

On the other hand, when the direction of ultrasonic vibration is parallel to the wiring direction, deformation of the electrodes and deformation of the the vicinities of the electrodes can be prevented due to the wires that extend from the electrodes. Thereby, adhesiveness of the electrodes at the bonding portions will increase and possible loss in ultrasonic energy will be prevented. Furthermore, by making the wire widths of the long wires smaller and by making the wire widths of the short wires larger, the difference in stiffness among the respective bonding portions can be made smaller. Thereby, bonding strength of the respective bonding portions can be improved while variation in bonding strength among the respective bonding portions can be reduced.

According to the present invention, deformations in the wires of the base substrate are adjusted at the time when ultrasonic bonding is carried out, whereby the relative stiffness of the respective wires will become almost the same. Therefore, variation in bonding strength among the respective electrodes can be reduced. Accordingly, a semiconductor device with high bonding reliability can be achieved.

With ultrasonic bonding, bonding is possible at a temperature below the solder melting temperature, which makes ultrasonic bonding extremely attractive in terms of its application to a stacked type semiconductor device. In this respect, it is highly probably that the present invention will be adopted for the mass production of semiconductor devices.

In the above-described exemplary embodiments, although gold electrodes are used as the electrodes of base substrate 12 and flexible substrate 20, the electrodes can be made of other materials, as long as the materials are electrically conductive and bondable by ultrasonic bonding.

In flexible substrate 20 according to the above-described exemplary embodiments, wires 22 are formed on the both surfaces of flexible substrate 20 and wires 22 on the both surfaces are electrically connected each other through the filled vias. The structure of flexible substrate 20, however, is not limited to such a structure. Flexible substrate 20 will be appropriate as long as it includes electrodes that can be connected with the electrodes of base substrate 12.

Furthermore, "second substrate" does not necessarily have to be a flexible substrate, while it could also be a rigid substrate. As for base substrate 12, an organic substrate made with epoxy, polyimide, or the like can be used, although it is not limited to such materials. When a rigid material such as ceramic, etc. is used for base substrate 12, variation in ultrasonic bonding strength depending on the lengths of wires can be reduced even further.

While preferred embodiments of the present invention have been described using specific terms, such description is for illustrative purposes only, and it is to be understood that changes and variations may be made without departing from the spirit or scope of the following claims.

The invention claimed is:

1. A semiconductor device comprising:
    a semiconductor chip;
    a first substrate including a plurality of wires and a plurality of first electrodes, each first electrode being connected with at least a corresponding one of the plurality of wires, and the widths of the wires being different depending on the lengths of the wires; and
    a second substrate including the semiconductor chip being mounted thereon, and a plurality of second electrodes, each second electrode being electrically connected with at least a corresponding one of the first electrodes of the first substrate,
    wherein a width of each one of the wires is inversely related to a length of the each one of the wires.

2. The semiconductor device according to claim 1, wherein one wire of the plurality of wires whose length is longer than the other wires of the plurality of wire is finer than the other wire.

3. The semiconductor device according to claim 1, wherein the wires become finer as the wires become longer.

4. The semiconductor device according to claims 1, wherein the second substrate includes:
    a first wire formed on one surface of the second substrate,
    a second wire formed on another surface of the second substrate, and
    a via which penetrates through the second substrate and which electrically connects the first wire and the second wire.

5. The semiconductor device according to claims 1, wherein the first substrate and the second substrate are bonded by ultrasonic bonding.

6. The semiconductor device according to claim 1, further comprising:
    a third substrate including a semiconductor chip being mounted thereon, the third substrate being stacked on the second substrate.

7. The semiconductor device according to claim 1, wherein the second substrate is a flexible substrate.

8. The semiconductor device according to claims 1, wherein the semiconductor chip is mounted on the second substrate and is electrically connected with the second substrate.

9. The semiconductor device according to claim 1, wherein the width of each one of the wires is inversely proportional with the length of the each one of the wires.

10. The semiconductor device according to claim 1, wherein the plurality of wires being formed on at least a first side and a second side of the first substrate, each of the plurality of wires on the first side of the first substrate being connected to a corresponding one of the plurality of wires on the second side through a corresponding one of a plurality of vias, and the widths of the plurality of wires varying according to a distance from a corresponding one of the plurality of first electrodes connected thereto.

11. A semiconductor device comprising:
a semiconductor chip;
a first substrate including a plurality of wires and a plurality of first electrodes, the plurality of first electrodes and the plurality of wires being formed on a first side and a second side of the first substrate and connected from the first side to the second side through corresponding vias, a width of each one of the wires, throughout a length, varying from other wires depending on the length; and
a second substrate including the semiconductor chip being mounted thereon, and a plurality of second electrodes, each second electrode being electrically connected with at least a corresponding one of the first electrodes of the first substrate.

12. The semiconductor device according to claim 11, wherein a width of each one of the wires is inversely proportional with a length of the each one of the wires.

13. The semiconductor device according to claim 11, wherein one wire of the plurality of wires whose length is longer than the other wires of the plurality of wire is finer than the other wire.

14. The semiconductor device according to claim 11, wherein the wires become finer as the wires become longer.

15. The semiconductor device according to claims 11, wherein the second substrate includes:
a first wire formed on one surface of the second substrate;
a second wire formed on another surface of the second substrate; and
a via which penetrates through the second substrate and which electrically connects the first wire and the second wire.

16. The semiconductor device according to claims 11, wherein the first substrate and the second substrate are bonded by ultrasonic bonding.

17. The semiconductor device according to claim 11, further comprising:
a third substrate including a semiconductor chip being mounted thereon, the third substrate being stacked on the second substrate.

18. The semiconductor device according to claim 11, wherein the second substrate is a flexible substrate.

19. The semiconductor device according to claims 11, wherein the semiconductor chip is mounted on the second substrate and is electrically connected with the second substrate.

* * * * *